Figure 1:
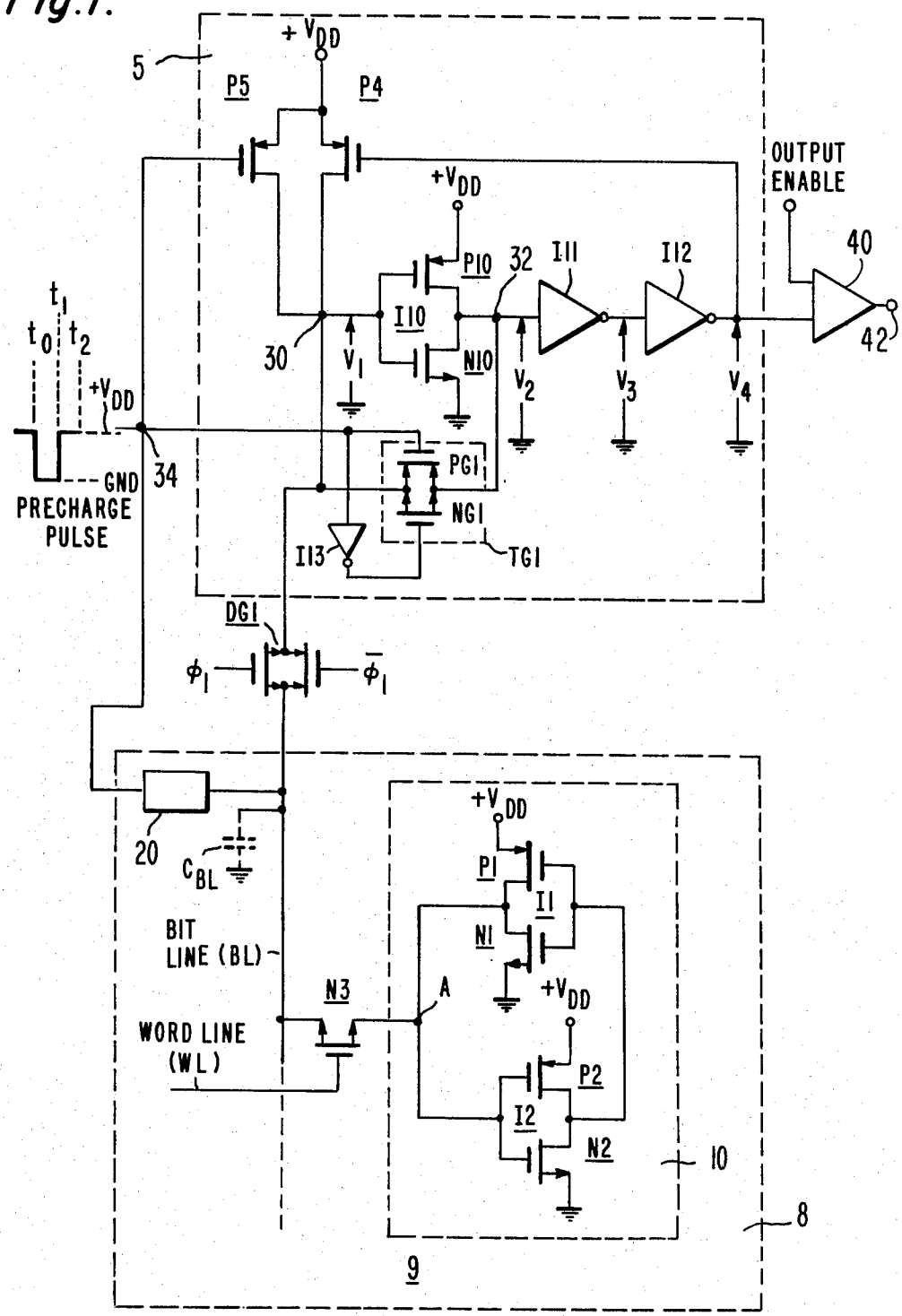

United States Patent [19]

Stewart

[11] 4,239,994
[45] Dec. 16, 1980

[54] ASYMMETRICALLY PRECHARGED SENSE AMPLIFIER

[75] Inventor: Roger G. Stewart, Neshanic Station, N.J.

[73] Assignee: RCA Corporation, New York, N.Y.

[21] Appl. No.: 931,747

[22] Filed: Aug. 7, 1978

[51] Int. Cl.³ .................. H03K 5/153; H03K 3/356; G11C 7/06
[52] U.S. Cl. .................................. 307/359; 307/238; 307/279; 307/DIG. 3; 365/208
[58] Field of Search ............... 307/279, 291, 354, 362, 307/363, 359, DIG. 3; 365/203, 205, 207, 208, 196

[56] References Cited

U.S. PATENT DOCUMENTS

| 3,828,204 | 8/1974 | Farnsworth | 307/359 |
|---|---|---|---|
| 3,849,673 | 11/1974 | Koo | 307/355 |
| 3,868,656 | 2/1975 | Stein et al. | 307/DIG. 3 X |
| 3,882,326 | 5/1975 | Kruggel | 307/DIG. 3 X |
| 4,050,030 | 9/1977 | Russell | 307/207 X |
| 4,096,401 | 6/1978 | Hollingsworth | 307/DIG. 3 X |
| 4,107,556 | 8/1978 | Stewart et al. | 307/355 X |
| 4,114,055 | 9/1978 | Hollingsworth | 307/DIG. 3 X |
| 4,150,311 | 4/1979 | Matsuda et al. | 307/355 |

OTHER PUBLICATIONS

De Simone et al., "Mosfet Sense Amplifier with Low-Output Impedance"; *IBM Tech. Discl. Bull.*; vol. 14, No. 8, pp. 2290–2291; 1/1972.
Chu et al., "Low-Power, High-Speed Sense Latch"; *IBM Tech. Discl. Bull.*; vol. 17, No. 9, pp. 2582–2583; 2/1975.
Surgent, "IGFET Sense Amplifier Latch"; *IBM Tech. Discl. Bull.*; vol. 13, No. 9, pp. 2670–2671; 2/1971.

*Primary Examiner*—Larry N. Anagnos
*Attorney, Agent, or Firm*—H. Christoffersen; H. I. Schanzer

[57] ABSTRACT

A sense amplifier having a transition point defining the signal level at its input above which it senses one binary condition and below which it senses the other binary condition includes precharge means for offsetting its input very slightly, above or below its transition point to place it in one of its two binary sensing states. The sense amplifier is suited for use with a memory array whose cells are coupled to the input of the sense amplifier via a single gating transistor which conducts in the (source or emitter) follower mode for the one binary condition and in the common (source or emitter) mode for the other binary condition. Following the precharge, the output of the memory cell is coupled to the input of the sense amplifier. For the cell storing the one binary condition for which the gating transistor conducts in the follower mode, the sense amplifier remains in the binary state to which its input was precharged. For the cell storing the other binary condition, the gating transistor conducts in the common mode and causes the sense amplifier to quickly change state.

15 Claims, 2 Drawing Figures

ASYMMETRICALLY PRECHARGED SENSE AMPLIFIER

This invention relates to sensing means, and in particular, to means for quickly and reliably sensing information stored in memory cells.

In the design of large memory arrays, a critical parameter is the largest number of memory cells that can be put on a chip, i.e. the packing density. To achieve a high packing density, the number of devices per memory cell must be small and the number of lines to access the cells must be as few as possible. A known static memory cell which satisfies these general requirements includes 5 transistors per cell. Four of the five transistors are connected to form a flip-flop. The fifth transistor, referred to herein as the "gating" transistor, functions as a transmission gate. It is connected between a single input-output (I/O) point to the flip-flop and an I/O or bit line and is used both to sense the state of the cell at selected times and to write information into the cell at other selected times. Although this cell has many advantages there are some problems associated with it.

Where a single gating transistor is used to read-out the information from the I/O point of the flip-flop onto the bit line, there exists one binary condition of the flip-flop for which the gating transistor operates in the (source or emitter) follower mode. In this mode, there is a voltage offset ($V_T$ or $V_{BE}$) between the control electrode (gate or base) of the transistor and one end of its conduction path (source or emitter), and this same offset appears across the conduction path of the transistor. As a result, during the read mode, the potential corresponding to the one binary condition is not fully coupled to the bit line making it difficult, if not impossible, to read that binary condition. For example, assume that the gating transistor is an insulated-gate field-effect transistor (IGFET) of N conductivity type. When a "high" signal is present at the I/O of the flip-flop and a like "high" signal of, for example, $V_{DD}$ volts is applied to the gate electrode of the gating transistor, the value of the signal coupled from the drain (I/O point) to the source (bit line) of the transistor is offset by at least the value of the threshold voltage, $V_T$, of the transistor. That is, the maximum value of potential coupled to the bit line is $V_{DD}-V_T$. When $V_{DD}$ is at the lower portion of its 2.5 volt to 15 volt range and $V_T$ is one or two volts, it is evident that the offset voltage across the gating transistor may prevent the "high" stored in the cell from being applied to the bit line. That is, the gating transistor cannot provide a sufficiently low impedance path for current flow from the cell to the bit line. Note that for the other binary condition, the gating transistor conducts in the common source mode and easily clamps the bit lines to the other binary condition.

The read problem is further aggravated in large high density memory arrays where the drive capability of the memory cell is decreased while the bit line capacitance is increased. This conflicts with the need to sense the contents of the cell quickly and reliably.

In circuits embodying the invention, a sense amplifier having a transition point which defines the level above which it senses signals representing one binary condition and below which it senses signals represents the other binary condition is precharged, at a time before sensing, to a voltage level which is offset relative to its transition point. The sense amplifier is well suited for use with a memory array whose cells can conduct relatively large current when storing a first binary conduction and much smaller, if any, current when storing the other, second binary condition. By way of example, the sense amplifier may be used to sense the output of a memory cell as described above, the contents of which are coupled to the sense amplifier via a single gating transistor which conducts in the common mode for a first binary condition and in the follower mode for the other second binary condition. The sense amplifier input is offset to that side of the transition point indicative of the second binary condition preferably by a small amount, so if the first binary condition is stored in the cell selected for read-out, the gating transistor conducts in the common mode and the other binary condition is quickly established at the sense amplifier input and output.

Figure 2:
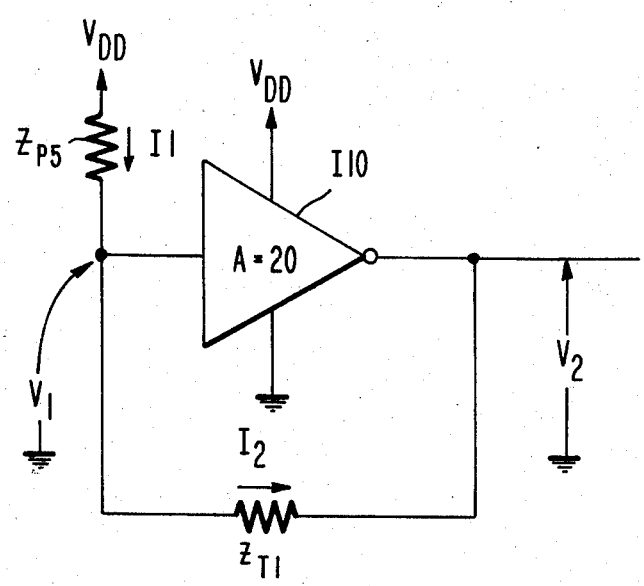

In the accompanying drawings:

FIG. 1 is a partial schematic, partial block diagram of a circuit embodying the invention; and FIG. 2 is a simplified idealized equivalent diagram of the sense amplifier of the invention during precharge.

In FIG. 1, enhancement type insulated-gate field-effect transistors (IGFETs) of P conductivity type are identified by the letter P followed by a particular reference numeral; and enhancement type IGFETs of N-conductivity type are identified by the letter N followed by a particular reference numeral. (For this reason, the circuit is illustrated in FIG. 1 as employing IGFETs and is so described hereinafter. This is not intended to preclude the use of other suitable devices and to this end, the term "transistor", when used without limitation in the appended claims, is used in a generic sense.)

The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive or less negative (higher) potential applied thereto. For an N-type IGFET the source electrode is defined as that one of the first and second electrodes having the less positive or more negative (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P type transistor its gate voltage ($V_G$) has to be more negative than its source voltage ($V_S$) by at least $V_T$. To turn on an N-type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near, ground is arbitrarily defined as a logic "0" or "low" condition and any potential at or near $+V_{DD}$ volts is arbitrarily defined as logic "1" or "high" condition.

The sense amplifier includes an inverter I10 comprised of complementary conductivity type IGFETs P10 and N10. The gate electrodes of P10 and N10 are connected to the inverter signal input terminal 30, their drain electrodes are connected to the inverter signal output terminal 32 and their source electrodes are connected to the inverter power terminals, $+V_{DD}$ and ground, respectively. The transition point $V_P$ of inverter I10 is defined as the particular voltage which applied to the gates of P10 and N10 would cause them to conduct equal amplitude currents between their respective source and drain electrodes. Accordingly the polarity of current flowing through the output 32 of inverter I10 into or out of inverter I10 will reverse as the signal voltage at input 30 crosses $V_P$. So, if one were to complete a feedback connection from the interconnection between the drain electrodes of P10 and N10 to the interconnection between their gate electrodes, in the absence of other currents than the difference between the drain currents of P10 and N10 being applied to either of these interconnections, the inverter I10 would self-bias itself to adjust the potential at the interconnected gates of P10 and N10 to $V_P$. For ease of description, it is assumed in the discussion to follow that transistors P10 and N10 have respective source-to-drain impedances $Z_{P10}$ and $Z_{N10}$ that are equal for like values of gate-to-source voltage ($V_{GS}$), making $V_P$ equal $+V_{DD}/2$.

Transistors PG1 and NG1 are arranged as a complementary transistor transmission gate TG1 for selectively completing a feedback connection from the output 32 of inverter I10 to its input 30 for biasing I10 in its linear region where it has highest gain. An inverter I13 is connected at its input to terminal 34, to which the gate of PG1 also connects, and is connected at its output to the gate of NG1 to drive it with the complement of the signal at terminal 34. Terminal 34 is normally "high-"—i.e., at $+V_{DD}$ causing transmission gate TG1 to be non-conductive by reason of the gates of transistors PG1 and NG1 being respectively "high" and "low", which causes them to present very high impedances between their respective source and drain electrodes. During selected intervals, e.g., between times $t_0$ and $t_1$ precharge pulses to ground are applied to terminal 34, making this terminal and the gate of PG1 "low" and the gate of NG1 "high", which causes these transistors to be conductive so the transmission gate TG1 provides, in effect, an equivalent low impedance $Z_{T1}$ between the output 32 and input 30 of inverter I10.

During these same selected intervals a transistor P5 having its source electrode connected to $+V_{DD}$ and having its drain electrode connected to input 30 of inverter I10, is placed into conduction by the voltage at terminal 34 applied to its gate electrode, being "low". P5 applies an offset current to input 30 of inverter I10, to increase $V_1$. $V_1$ increases just sufficiently to increase the conduction of N10 vis-a-vis that of P10 so as to sink the offset current supplied through P5 as well as the current supplied through P10. This occurs when the feedback connection from the output 32 of inverter I10 to its input 30 is selectively completed by transmission gate TG1 being conductive to complete a feedback loop with inverter I10. This feedback loop causes $V_1$ to adjust to a value with a slight positive offset from the transition point $V_P$ at which transistors P10 and N10 conduct like currents, for predisposing $V_2$ to be "low".

When the precharge pulse is over, e.g. at time $t_2$, terminal 34 returns "high", removing P5 and the transistors PG1 and NG1 in transmission gate TG1 from conduction. The precharge on the capacitance associated with point 30 tends to maintain N10 in its same excess of conduction over P10 in inverter I10, so $V_2$ is reduced towards ground, presenting a "low" at output 32 of inverter I10.

Another transistor P4 has its source connected to $+V_{DD}$ and its drain connected to the input 30 of inverter I10. The turn on and turn off of transistor P4 is controlled by means of cascaded inverters I11 and I12, whose transition points are, preferably, those to the $V_P$ of I10. I11 is connected at its input to the output of I10. I12 is connected at its input to the output of I11 and at its output to the gate of P4. The signal ($V_4$) applied to the gate of P4 is, therefore, derived from and is in phase with, the output ($V_2$) of I10 and is, in fact, $V_2$ amplified by I11 and I12.

The output ($V_4$) of inverter I12 which is an output of the sense amplifier is applied to a first one of the two inputs of gate 40. Whenever an output enable signal is applied to the second input of gate 40, the sense amplifier output is coupled to output terminal 42. Logic gates to perform the function of gate 40 are well known in the art and need not be detailed here.

To facilitate the following more detailed discussion of the operation of a specific sense amplifier embodying the present invention, assume that: (1) for the same value of $V_{GS}$, the ON impedance ($Z_{P5}$) of P5 is 10 times the ON impedance ($Z_{T1}$) of TG1 and one tenth (1/10) the ON impedance ($Z_{P4}$) of P4; (2) the output impedance of I10 when conducting is considerably less than $Z_{T1}$ by reason of the respective ON impedances $Z_{P10}$ and $Z_{N10}$ of P10 and N10 being considerably smaller than $Z_{T1}$; (3) the precharge is initiated by a negative going precharge pulse applied to terminal 34 at time $t_0$ and is terminated when terminal 3A returns "high" at time $t_1$; and (4) a signal to be sensed is applied to node 30 at time $t_2$ after time $t_1$, (although, alternatively the signal to be sensed could be applied shortly after the initiation of precharge between $t_0$ and $t_1$).

The role of P5 in setting $V_1$ slightly, but distinctly, above the transition point ($V_{DD}/2$) is now examined, in more detail (P4 may be ignored at this point in the discussion because either it is off, or, though it is on, it has a much higher impedance than $Z_{P5}$). FIG. 2 is an idealized representation of the functions performed by I10, TG1 and P5. In FIG. 2 I10 is represented by a high input impedance amplifier, having the relatively high gain exhibited by an inverter when operated close to its transition point, TG1 is represented by feedback element $Z_{T1}$ connected between the input and output of inverter I10, and P5 is represented by biasing element $Z_{P5}$.

Referring to FIG. 2 it is clear that, for the high impedance inverter I10, the current $I_1$ is equal to the current $I_2$. The relationship of $I_1 = I_2$ may be mathematically expressed as:

$$\frac{V_{DD} - V_1}{Z_{P5}} = \frac{V_1 - V_2}{Z_{T1}} \qquad \text{eq. 1}$$

Furthermore, the relationship between the output ($V_2$) and input ($V_1$) of I10 in terms of the open loop gain (A) of the inverter may be expressed as:

$$\Delta V_2 = -A \Delta V_1 \qquad \text{eq. 2}$$

For $V_1$ and $V_2$ initially at a transition point ($V_P$) due to TG1 being conductive: $\Delta V_1$ and $\Delta V_2$ may be expressed as:

$$\Delta V_2 = V_2 - V_P \text{ and } \Delta V_1 = V_1 - V_P \qquad \text{eq. 3}$$

By substituting eq. 3 into eq. 2 and solving for $V_1$ from eq. 1 it may be shown that:

$$V_1 = \frac{V_P + V_{DD}\frac{Z_{T1}}{(A+1)Z_{P5}}}{1 - \frac{Z_{T1}}{(A+1)Z_{P5}}} \qquad \text{eq. 4}$$

which to a first approximation reduces to:

$$V_1 = V_P + \left(\frac{V_{DD}}{(A+1)}\right)\left(\frac{Z_{T1}}{Z_{P5}}\right) \qquad \text{eq. 5}$$

From eq. 5 it may be observed that $V_1$ is offset with respect to $V_P$ by an amount ($\Delta V_1$) equal to ($V_{DD}/A+1$) times ($Z_{T1}/Z_{P5}$). For $V_P=V_{DD}/2$, $V_{DD}=5$ volts, $A=20$, and $Z_{T1}=0.1 \cdot Z_{P5}$, the offset ($\Delta V_1$) in $V_1$ may be calculated to be equal to $+0.024$ volts.

The potential at $V_1$ is clearly above the assumed transition point of $V_{DD}/2$, but by a very small $\Delta V_2$. The smallness of the $\Delta V_1$ is attributable to the inverter I10 operating in the linear portion of its characteristic wherein its voltage gain is high so only a small deviation from $V_P$ is necessary to increase the drain current of N10 sufficiently to sink the drain current of P5, which is relatively small compared to the drain currents of N10 and P10, owing to N10 and P10 having been assumed to have respective ON impedances $Z_{N10}$ and $Z_{P10}$ much smaller than the ON impedance $Z_{P5}$ of P5. That the offset $\Delta V_1$ is so small is highly significant. The offset $\Delta V_1$, although small, is sufficient to indicate the presence of a "high" at node 30, but is so small that node 30 can be quickly discharged and $V_1$ made negative with respect to $V_P$.

For TG1 and P5 on, $V_1$ is slightly more positive than $V_{DD}/2$ by the amount $\Delta V_1$. Reliable detection of $\Delta V_1$ is enhanced by amplification through I10, I11, and I12. Thus, the difference between $V_2$ and $V_P$, during precharge, is greater than the difference between $V_1$ and $V_P$. That is, the offset, $\Delta V_1$, at the input of I10 is amplified by I10 before being applied to the next stage I11. Assuming I10 to have an open loop voltage gain of 20, since it is biased in its linear region by $V_1$ departing from $V_P$ by only a small $\Delta V_1$, the change $\Delta V_2$ in $V_2$ responsive to the change $\Delta V_1 = +0.024$ volt will be $-0.48$ volt, continuing the example above. This makes $V_2$ substantially less positive than $+V_{DD}/2$, so inverter I11 assumed to have a $V_P$ of its own equal to $+V_{DD}/2$ will be definitely biased to cause its output voltage $V_3$ to be "high". Since I11 senses the bit line voltage indirectly via the output of I10 where the signal voltage is 0.48 volt instead of only 0.024 volt, mismatch errors between I11 and I10 (caused by $V_T$ variations, geometry variations, etc.) are unlikely to present any problem in practice. Inverters I11 and I12 are operated with full open loop voltage gain which may be assumed to be in the range of 20 for each of them. Accordingly, the output $V_3$ of inverter I11 is considerably more positive than $V_{DD}/2$ and the output $V_4$, of inverter I4, is very much more negative than $V_{DD}/2$ and may be assumed to be at, or close to ground potential. Hence, the output ($V_4$=Low) of I12 reliably indicates the presence of a "high" at node 30 despite the high at node 30 being, in fact, a very slightly positive signal with respect to $V_P$.

It should be appreciated that even if P4 were a lower impedance device, it would still not eliminate the need for P5 which is turned on by the precharge pulse. If P5 were not present in the circuit and for the condition of the memory cells sinking current out of node 30, the turn on of TG1 would bring $V_1$ close to, but still more negative than, $V_P$ (assumed to be $V_{DD}/2$). The voltage offset at node 30 would, therefore, be negative with respect to $V_{DD}/2$. Consequently, $V_2$ would be more positive than $V_{DD}/2$, $V_3$ would be substantially more negative than $V_{DD}/2$ and $V_4$ would be at, or close to, $V_{DD}$ whereby P4 would be turned off. Thus, P5 ensures that whenever the precharge pulse is present, $V_1$ is made more positive than the $V_P$ of I10. Also, the restriction on the maximum current that P4 can source (the current through P4 must be much less than the smallest cell sink current) makes its impedance too high to adequately bias the input node 30 fast enough or high enough.

The advantage of making $Z_{T1}$ larger than the impedance offered by inverter I10 at its output 32 is that the voltage gain of I10 is not appreciably reduced by $Z_{T1}$ appearing between its output 32 and its input 30. This permits a relatively large $\Delta V_2$ to be established at output 32 during the precharge interval, rather than time being required to develop a well-defined "low" condition of $V_2$ subsequent to the time $t_1$ that the precharge interval ends. Thus, logic "one" state can be sensed just after $t_1$ or even somewhat before. In applications where one does not look to make sensing as rapid as possible, $Z_{T1}$ need not be so much larger than the output impedance of the inverter I10.

With $V_4$ at the "low" level P4 is turned full on. But, as noted above, P4 is a very high impedance device and its effect on the circuit is not significant until P5 and TG1 are turned off. P4, typically, conducts much less current than is sunk by any one memory cell. P4 is designed to prevent node 30 from floating between the power supply lines when P5 and TG1 are turned off. During sensing of a logic "one" level P4 functions to supply a current into node 30 which, for the condition P5 and TG1 turned off, and for little, if any, leakage current being drawn from node 30, ensures that node 30 is charged towards $V_{DD}$. This turns off P10 cutting off steady-state current conduction and power dissipation in inverter I10. During sensing of a logic "zero" state, the bit line will be slowly driven to ground and held there by the memory cell. This also cuts off steady-state current conduction through I10.

It will now be shown that the sense amplifier of FIG. 1 can be used to quickly sense the contents of a memory cell which can source (supply) little or no current onto the bit line but which can sink (draw) relatively large current from the bit line.

For purpose of illustration one cell 9 of a memory array 8 is shown in FIG. 1. The memory array and the cell may be, for example, of the type disclosed in copending application of Applicant Roger Green Stewart and Andrew Gordon Francis Dingwall entitled "Precharge Circuit for Memory Array" filed Aug. 7, 1978 and assigned Ser. No. 931,748, and need not be greatly detailed here. The cell 9 includes a flip-flop 10 comprised of two cross-coupled inverters I1 and I2 and a gating transistor N3 whose conduction path is connected between the input-output (I/O) point A of the flip flop and a bit line. A word line is connected to the gate electrode of N3 and controls its conductivity. For purpose of illustration, it is assumed that during read a signal of $V_{DD}$ volts is applied to the word line.

At the termination of the precharge pulse, at time $t_1$, P5 and TG1 are turned off, $V_1$ remains at $V_{DD}/2+\Delta V_1$; $V_2$ is at $V_{DD}/2-A\cdot\Delta V_1$; $V_3$ is at or close to $V_{DD}$ volts and $V_4$ is at or close to ground potential. P4 is still turned on but its effect is still negligible since its small current would cause $V_1$ to go positive very slowly. After the termination of the precharge pulse, or slightly before its termination, the bit line (BL) is coupled to node 30 via the low ON impedance of a decode gate DG1, which is enabled by means of decoding signals $\phi_1$ and $\bar{\phi}_1$. The bit line may be assumed to have been precharged to $V_{DD}/2$ by means of a precharge circuit 20 enabled in response to the precharge pulse at node 34 or, to a pulse derived from it or related to it. When the contents of the cell are to be read out, a signal of $V_{DD}$ volts is applied to the word line connected to N3.

For the condition of the memory cell 10 storing a "0", transistor N1 of inverter I1 is turned on and conducts in the common source mode. Gating transistor N3 also conducts in the common source mode. Transistors N1 and N3 with $V_{DD}$ volts on their gates can sink a relatively large current when conducting in the common source mode. Assuming the current (i) sunk by N1 and N3 to be 20 microamperes, the total capacitance (C) at node 30 and on the bit line to be 5 pf, and $\Delta V_1$ to be 0.024 volt, the time required to switch inverter I10 from a "high" of $+V_{DD}/2+\Delta V_1$ to a "low" at $+V_{DD}/2-\Delta V_1$ may be calculated to a rough approximation as follows:

$$t = \frac{2 \cdot \Delta V_1 \cdot C}{i} \qquad \text{eq. 6}$$

From equation 6, the time to read a "0" is found to be equal to approximately 12 nanoseconds. Assuming that the transition could be set perfectly at $V_P$ and that a $\Delta V_1$ would be necessary to detect a "0", it would take 6 nanoseconds to read the "0". Hence, in the circuit of FIG. 1 the read out of the "0" has been increased from a theoretical 6 nanoseconds to 12 nanoseconds. However, it will be shown below that this is a small price to pay for the significant gain in detecting a "1". For the cell storing a "0" as soon as $V_1$ decreases below $V_P-\Delta V_1$, $V_2$ increases to $V_P+A\cdot\Delta V_1$, $V_3$ goes to, or close to, ground and $V_4$ goes to, or close to, $+V_{DD}$.

For the condition of the memory cell storing a "1", transistor P1 of I1 conducts in the common source mode, but N3 now conducts in the source follower mode. In the source follower mode the impedance of the source-drain path of the transistor is much greater than in the common source mode. Note that although $V_{DD}$ is applied to the gate, as when reading a "0", the source is now becoming more positive such that the $V_{GS}$ of the transistor is less than when a "0" is read. Thus, although P1 may be assumed to be able to supply a current of 20 microamperes into node A, N3 cannot pass that much current and, therefore, limits the amount of cell current available to charge up the bit line. For example, if N3 can pass a current of 5 microamperes and if node 30 were at $V_P$, it would take approximately 24 nanoseconds to charge node 30 to $+\Delta V_1$. In fact, measurements made with $V_{DD}$ in the range of 3 to 5 volts indicate that the time to charge the bit line to a detectable level (comparable to $\Delta V_1$ at node 30) ranges up to over 9,000 nanoseconds.

The problem of relying on N3 conducting in the source follower mode is avoided in the circuit of FIG. 1. There is no need for N3 to charge the bit line to the "1" level since node 30 is already at $V_{DD}/2+\Delta V_1$ and $V_4$ indicates the presence of a "high". Therefore, when gating transistor N3 is turned on and the cell is storing a "1", the output of the sense amplifier is already at the correct level. The time to charge the bit line to a small positive level which in the prior art required tens to thousands of nanoseconds is completely eliminated. That the memory cell can source little, or no, current is no longer a concern. In circuits according to the invention, the bit line instead of being precharged to $V_{DD}/2$ volts, is precharged to $V_{DD}/2+\Delta V_1$ volts. Read out of the "0" is, therefore, increased by the time it takes to discharge the additional $\Delta V_1$ volts. But, the circuit of the invention limits $\Delta V_1$ to such a small value that this is of no concern in comparison to the considerable time saved in reading out the "1" level without delay.

It should be appreciated that in the circuit of FIG. 1 the sense amplifier is charged to $V_P+\Delta V_1$ (the "1" binary condition) because the gating transistor conducts in the source follower for the cell storing a "1". If, instead, the gating transistor were of P-conductivity type it would conduct in the source follower mode for the cell storing a "0". The input of the sense amplifier would then be precharged by an offset $\Delta V_1$ which would be negative relative to $V_P$. Instead of P-type IGFET P5, an N type transistor with its conduction path connected between node 30 and ground and its gate driven by a precharge pulse of appropriate polarity could be used. Needless to say, P4 would then also be replaced by an N type transistor whose conduction path would be in parallel with that of the N type transistor.

Although the sense amplifier has been shown in conjunction with a memory cell adapted for use in a random access memory (RAM), it should be appreciated that sense amplifiers embodying the invention could be used in conjunction with many other types of memories such as read-only memories (ROM's) and electrically-alterable ROMs. These sense amplifiers offer improved speed of read out with any memory cell which can conduct a relatively large current for one binary condition but conducts little, if any, current for the other binary condition.

It should be appreciated that the ratio of the size P10 to N10 forming inverter I10 may be made similar to the ratio of P1 and N1 forming inverter I1 and/or P2 and N2 forming inverter I2 of the memory cell 9. This ensures that the $V_P$ of the sense amplifier and the flip point of the memory cell are close to each other and that they track over temperature and power supply variations.

What is claimed is:
1. A sense amplifier comprising:
an inverter having a signal input terminal, a signal output terminal, and first and second power terminals for receiving an operating potential therebetween and exhibiting a transition point between first and second logic conditions at its output signal terminal responsive to a particular voltage being applied to its input signal terminal;
means for supplying recurring precharge pulses;
selectively enabled feedback means responsive to each precharge pulse for completing a feedback connection from the output signal terminal of said inverter to its input signal terminal only for the duration of each precharge pulse; said feedback means including a feedback transistor having a conduction path and a control electrode and wherein the conduction path of said feedback transistor is connected between the input and the output of said inverter;

selectively enabled bias means responsive to each precharge pulse applying an offset current during each precharge pulse to the signal input terminal of said inverter of such polarity that the input signal terminal of said inverter adjusts to a value which is offset from said particular voltage, for predisposing the signal at the output signal terminal of said inverter to exhibit said first logic condition at the conclusion of each precharge pulse, said selectively enabled biasing means including a biasing transistor having its conduction path connected between said one of said first and second power terminals and said input of said inverter; and wherein said selectively enabled feedback and biasing means include means for turning on said feedback and biasing transistors concurrently, for the duration of each precharge pulse, and for turning them off concurrently during intervals between succeeding precharge pulses; and means for selectively applying signals to be sensed to the input signal terminal of said inverter, at selected times, each of which times follows the inception of a precharge pulse.

2. A sense amplifier as set forth in claim 1 wherein said selectively enabled biasing means exhibits a higher impedance than that of said feedback connection or of the output impedance said inverter exhibits at its signal output terminal.

3. A sense amplifier as set forth in claim 1 wherein said feedback connection has a higher impedance than the impedance said inverter exhibits at its signal output terminal.

4. A sense amplifier as claimed in claim 1 wherein said selectively enabled feedback means includes another transistor having a conduction path and a control electrode, and wherein the conduction paths of said another transistor is connected in parallel with the conduction path of said feedback transistor between the input and the output of said inverter; said feedback and said another transistor being first and second transistors, and said biasing transistor being a third transistor.

5. A sense amplifier as claimed in claim 4 further including: (1) a fourth transistor having a conduction path and a control electrode, the conduction path of said fourth transistor being connected in parallel with the conduction path of said third transistor; and (2) means connected to the control electrode of said fourth transistor for applying thereto a signal in phase with the signal at the output of said inverter.

6. A sense amplifier as claimed in claim 5 wherein the ON impedance of the conduction path of said fourth transistor is substantially greater than the ON impedance of said third transistor.

7. A sense amplifier as claimed in claim 6 wherein said inverter is a first inverter; wherein said means connected to the control electrode of said fourth transistor includes second and third inverters, each inverter having a signal input, and a signal output;

wherein the input of said second inverter is connected to the output of said first inverter; wherein the output of said second inverter is connected to the input of said third inverter; and wherein the output of said third inverter is connected to the control electrode of said fourth transistor.

8. A sense amplifier as claimed in claim 7 wherein said first, second, third and fourth transistors are insulated-gate field-effect transistors, (IGFETs), said second IGFET being of opposite conductivity type to that of said first, third and fourth IGFETs; and wherein said first, second and third inverters are complementary inverters, each inverter including a respective pair of IGFETs of opposite conductivity types.

9. A sense amplifier as claimed in claim 1 wherein said means for selectively applying signals to be sensed to the input signal terminal of said inverter, consists of:

means for selectively applying signals to be sensed to the input signal terminal of said inverter, at selected times, each of which times follows the conclusion as well as inception of a precharge pulse.

10. In combination with a memory cell having an input-output (I/O) point and a bit line and a gating transistor whose conduction path is connected between said I/O point and said bit line, said gating transistor conducting in the follower mode for one value of binary signal at said I/O point, a sense amplifier comprising:

amplifying means having an input and an output, having first and second terminals for the application therebetween of an operating potential, and exhibiting a transition point between first and second logic conditions at its output responsive to a particular voltage being applied to its input;

means connecting the input of said amplifying means to said bit line;

selectively enabled feedback means for completing, when enabled, a feedback connection between said output and said input of said amplifying means;

a selectively enabled biasing means for applying, when enabled, an offset current to said input of said amplifying means; and means connected to said feedback means and to said biasing means for enabling them concurrently for precharging the input of said amplifier to a voltage offset from said particular voltage for predisposing the output of said amplifier to exhibit said first logic condition.

11. The combination as claimed in claim 10 wherein said amplifying means is an inverter and wherein the voltage offset relative to said particular voltage is approximately proportional to said offset current, approximately inversely proportional to the open loop gain of the inverter, and directly proportional to the impedance of the feedback connection.

12. The combination as claimed in claim 10 wherein said amplifying means is an inverter, and wherein said biasing means includes a first transistor of a conductivity type opposite to the conductivity type of said gating transistor.

13. The combination as claimed in claim 10 wherein said amplifying means is an inverter, and wherein said selectively enabled feedback means includes a complementary transistor transmission gate whose conduction path is connected between the input and output of said inverter; and wherein said selectively enabled biasing means and said feedback means are concurrently enabled by a precharge pulse and are current disabled at the termination of said precharge pulse; and wherein said gating transistor is enabled only after said feedback means and said biasing means have been enabled.

14. In combination with a memory array of cells characterized in that a relatively large current can flow between a cell and an associated bit line for the cell storing one binary condition and little, if any, current can flow between the cell and its bit line for the cell storing the other binary condition, a sense amplifier comprising:
- amplifying means having an input and an output, having first and second terminals for the application therebetween of an operating potential, and exhibiting a transition point between first and second logic conditions at its output responsive to a particular voltage being applied to its input;
- means connecting the input of said amplifying means to said bit line;
- selectively enabled feedback means for completing, when enabled, a feedback connection between said output and said input of said amplifying means;
- a selectively enabled biasing means for applying, when enabled, an offset current to said input of said amplifying means; and
- means connected to said feedback means and to said biasing means for enabling them concurrently for precharging the input of said amplifier to a voltage offset from said particular voltage for predisposing the output of said amplifier to exhibit said first logic condition.

15. The combination as claimed in claim 14 wherein said amplifying means is an inverter and wherein the voltage offset relative to said particular voltage is approximately proportional to said offset current, approximately inversely proportional to the open loop gain of the inverter, and directly proportional to the impedance of the feedback connection.

* * * * *